US010896123B2

(12) United States Patent
Yang et al.

(10) Patent No.: US 10,896,123 B2
(45) Date of Patent: Jan. 19, 2021

(54) ENHANCING THE EFFECTIVENESS OF READ SCAN PERFORMANCE AND RELIABILITY FOR NON-VOLATILE MEMORY

(71) Applicant: Western Digital Technologies, Inc., San Jose, CA (US)

(72) Inventors: Nian Niles Yang, Mountain View, CA (US); Sahil Sharma, San Jose, CA (US); Philip Reusswig, Mountain View, CA (US); Rohit Sehgal, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 48 days.

(21) Appl. No.: 16/218,800

(22) Filed: Dec. 13, 2018

(65) Prior Publication Data
US 2020/0192791 A1   Jun. 18, 2020

(51) Int. Cl.
*G06F 12/02* (2006.01)
*G11C 16/34* (2006.01)
*G11C 29/42* (2006.01)
*G06F 11/10* (2006.01)
*G11C 29/52* (2006.01)
*H04L 1/20* (2006.01)

(52) U.S. Cl.
CPC ...... *G06F 12/0246* (2013.01); *G06F 11/1068* (2013.01); *G11C 16/3431* (2013.01); *G11C 16/3495* (2013.01); *G11C 29/42* (2013.01); *G11C 29/52* (2013.01); *H04L 1/203* (2013.01); *G06F 2212/7211* (2013.01)

(58) Field of Classification Search
None
See application file for complete search history.

(56) References Cited

U.S. PATENT DOCUMENTS

| | | | | |
|---|---|---|---|---|
| 9,672,940 B1* | 6/2017 | Reusswig | ............... | G11C 16/10 |
| 2008/0239851 A1* | 10/2008 | Lin | .................... | G11C 16/3418 365/222 |
| 2010/0131697 A1* | 5/2010 | Alrod | .................. | G06F 11/1068 711/103 |
| 2013/0326284 A1* | 12/2013 | Losh | .................... | G06F 11/2053 714/47.2 |
| 2014/0059405 A1* | 2/2014 | Syu | ...................... | G11C 16/349 714/773 |
| 2014/0115410 A1* | 4/2014 | Kealy | ..................... | G06F 11/00 714/704 |

(Continued)

*Primary Examiner* — Kaushikkumar M Patel
(74) *Attorney, Agent, or Firm* — Vierra Magen Marcus LLP

(57) ABSTRACT

Techniques are described for performing a read scan process on a non-volatile memory system in order to determine memory blocks that may have a high bit error rate, where if such blocks are found they can be refreshed. Rather than work through the blocks of a memory system sequentially based on the physical block addresses, the memory system maintains a measure of data quality, such as an estimated or average bit error rate, for multi-block groups. For example, the groups can correspond to regions of memory die in the system. The groups are ranked by their data quality, with the groups being scanned in order of the data quality. The blocks within a group can also be ranked, based on factors such as the program/erase count.

16 Claims, 13 Drawing Sheets

(56) References Cited

U.S. PATENT DOCUMENTS

| | | | |
|---|---|---|---|
| 2015/0058535 A1* | 2/2015 | Lasser | G06F 12/0246 711/103 |
| 2015/0113203 A1* | 4/2015 | Dancho | G06F 3/0679 711/102 |
| 2015/0113207 A1* | 4/2015 | Shin | G06F 12/0246 711/103 |
| 2015/0169403 A1* | 6/2015 | Yen | G06F 11/1048 714/760 |
| 2015/0179284 A1* | 6/2015 | Alrod | G06F 11/076 714/704 |
| 2016/0170682 A1* | 6/2016 | Bakshi | G06F 3/0647 711/103 |

* cited by examiner

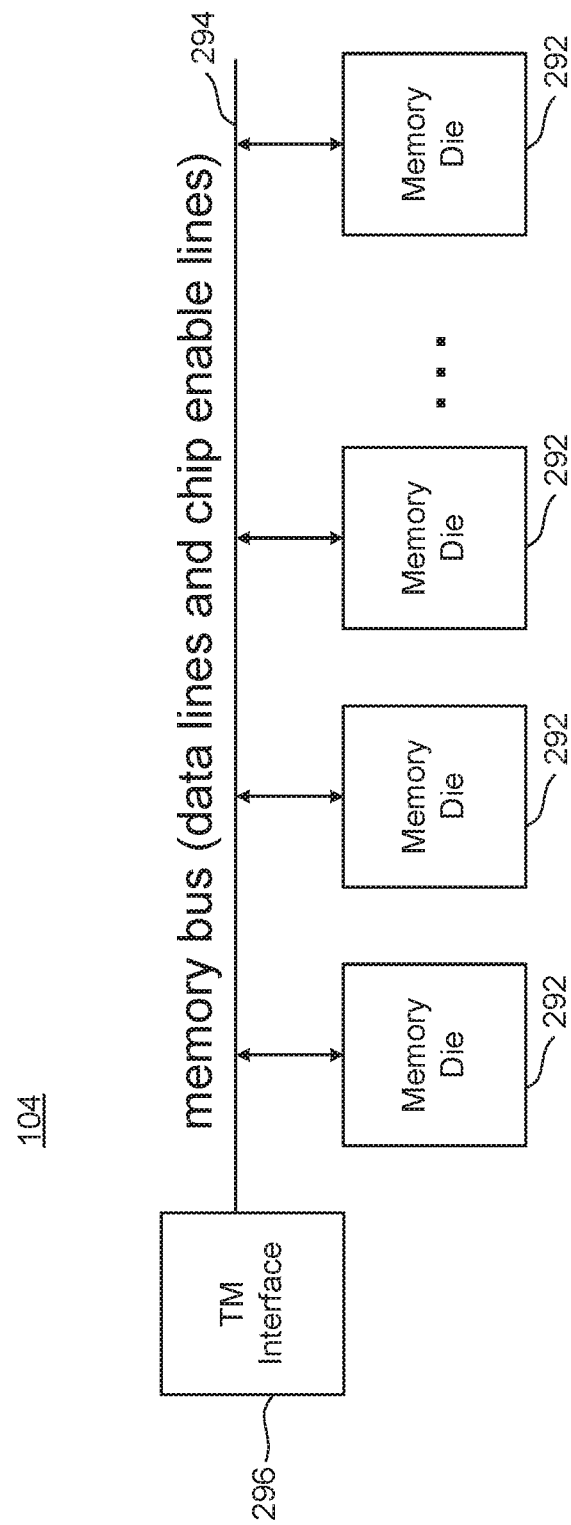

$CVD = (physical\ address\ range;\ time\ stamp;\ [Vr],\ [Vv],\ ...;\ BER)$

Page = (CW1, CW2, ..., CWi, ..., CWn)

CWi = (DATAi; ECCi)

ENHANCING THE EFFECTIVENESS OF READ SCAN PERFORMANCE AND RELIABILITY FOR NON-VOLATILE MEMORY

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. It is important that when data stored in the memory system is read back and reported to the host device, client, user or other entity, the data is reported back accurately.

BRIEF DESCRIPTION OF THE DRAWINGS

Like-numbered elements refer to common components in the different figures.

FIG. 4 is a block diagram of one embodiment of a memory package.

DETAILED DESCRIPTION

Figure 1:
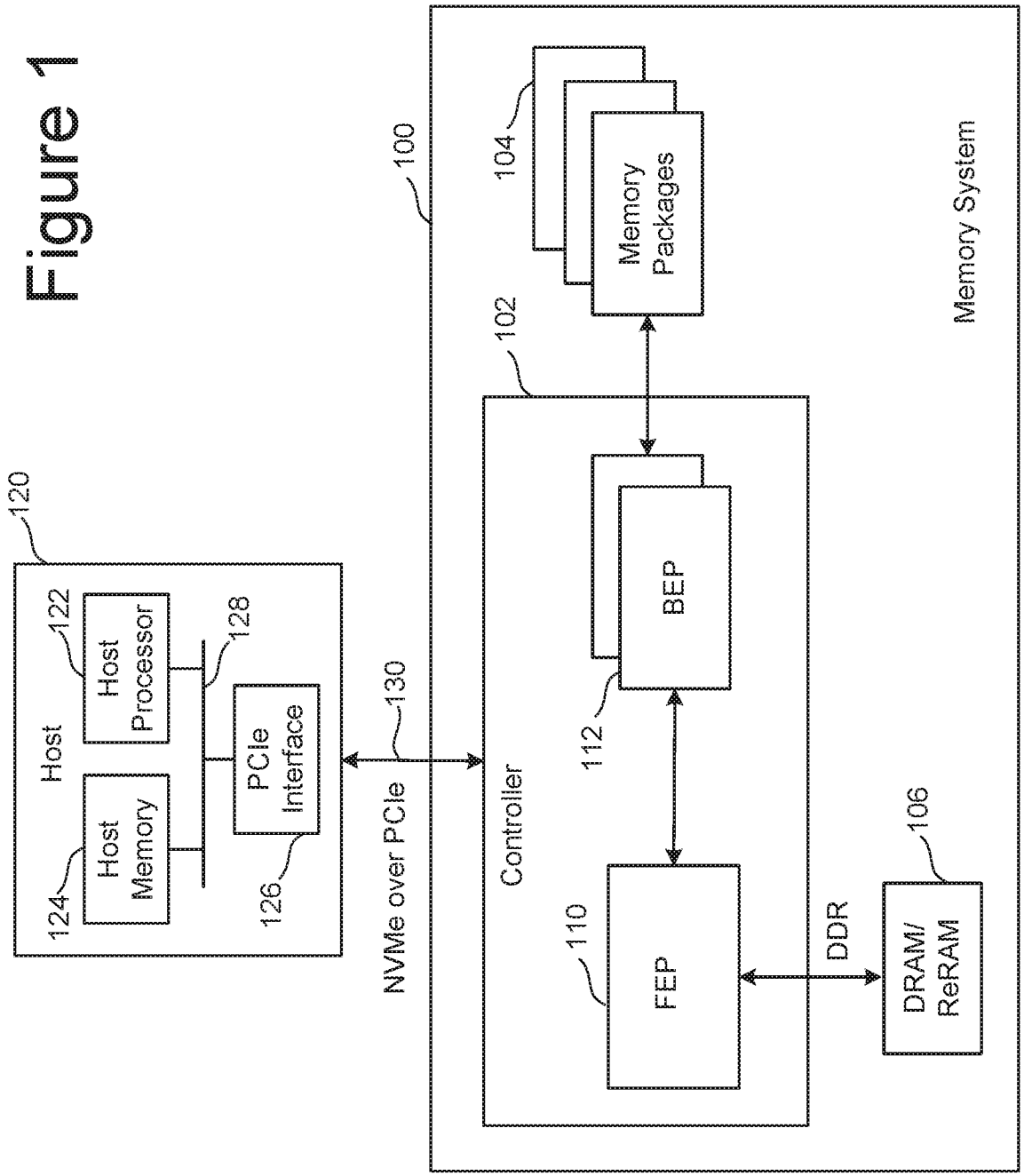
FIG. 1 is a block diagram of one embodiment of a memory system connected to a host.

Data stored in a non-volatile memory can degrade over time. For example, in a charge storing memory the data state of a memory cell is based on the memory cell's threshold voltage, which in turn is dependent on the amount of charge stored in the memory cell. Over time, the threshold state of a memory cell can drift, such as due to "disturbs" during read, write or erase operations on other memory cells of a device or due to charge leakage. If the threshold voltage of a memory cell drifts too far, the memory system will not be able to recover the data stored on the memory cell. In a multi-state cell (MLC) memory, each cell stores multiple bits of data. As the number of states stored in an individual memory cell increases, and threshold window within which these states are stored decreases, the amount by which a memory cell's threshold voltage can drift before it becomes unreadable become less and less. Memory systems typically employ error correction code (ECC) and other techniques to deal with error, but at some point, a memory system's capability for handling errors will become overwhelmed.

One technique for managing error is to periodically perform a read scan, reading the memory cells of a memory system and, if more than some amount of error is found, refreshing the portion of memory that has large amounts of error by reading out the data, correcting it, and storing the corrected data back in the memory system. A periodic read scan can be used for monitoring the health of the memory blocks in the system. A typical prior art read scan algorithm is based on a round robin algorithm where the user blocks are scanned sequentially in a fixed order, such as from the first physical block address to the last physical block address. In a high capacity memory system, such as a solid state drive (SSD), the number of blocks can be quite large, so that a full read scan can take a large amount of time. This arrangement is not efficient as there could be intrinsic block bit error rate (BER) differences among these blocks and the more vulnerable blocks may or may not be able to be scanned in time. If a vulnerable block is not scanned and handled before it is read by the host, a higher BER may incur and the SSD may suffer performance or even reliability consequences.

To be able to perform a read scan more efficiently and address this problem, rather than scan the blocks sequentially based on their physical addresses, a read scan process is introduced that targets memory blocks more likely to be part of a high BER region. The memory system maintains metadata on different multi-block sets or regions of the memory system, including a range or estimate of a BER rate for a set of blocks or regions as a group. The memory system ranks the sets of blocks based on the BERs (or other data quality indication for the sets) and, starting with the set of blocks with the highest range or estimate of BER, scans the blocks of the different sets. Within a given set, the blocks can be further ordered for the read scan based on additional metadata, such as the number of program/erase cycles.

FIG. 1 is a block diagram of one embodiment of a memory system 100 connected to a host 120. Memory system 100 can implement the technology proposed herein for read scan operations. The memory system 100 includes a controller 102 that encodes data streams with a corresponding level of ECC, forms the streams into ECC codewords, forms the codewords into pages, and transfers the pages to memory packages 104 to be written into memory. Many different types of memory systems can be used with the technology proposed herein. Example memory systems include solid state drives ("SSDs"), memory cards and embedded memory devices; however, other types of memory systems can also be used.

Memory system 100 of FIG. 1 comprises the controller 102, non-volatile memory 104 for storing data, and local memory (e.g. DRAM/ReRAM) 106. Controller 102 comprises a Front End Processor (FEP) circuit 110 and one or more Back End Processor (BEP) circuits 112. In one embodiment FEP circuit 110 is implemented on an ASIC. In one embodiment, each BEP circuit 112 is implemented on a separate ASIC. In other embodiments, a unified controller ASIC can combine both the front end and back end functions. In one embodiment, the ASICs for each of the BEP circuit(s) 112 and the FEP circuit 110 are implemented on the same semiconductor such that the Controller 102 is manufactured as a System on a Chip ("SoC"). FEP circuit 110 and BEP circuit 112 both include their own processors. In one embodiment, FEP circuit 110 and BEP circuit 112 work as a master slave configuration where the FEP circuit 110 is the master and each BEP circuit 112 is a slave. For example, FEP circuit 110 implements a Flash Translation Layer (FTL) or Media Management Layer (MML) that performs memory management (e.g., garbage collection, wear leveling, etc.), logical to physical address translation, communication with the host 120, management of DRAM (local volatile memory), and management of the overall operation of the SSD (or other non-volatile storage system). The BEP circuit(s) 112 manages memory operations in the memory packages/die at the request of FEP circuit 110. For example, the BEP circuit(s) 112 can carry out the read, erase, and programming processes. Additionally, the BEP circuit(s) 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory of memory packages 104 comprises a plurality of memory packages. Each memory package includes one or more memory die. Therefore, Controller 102 is connected to one or more non-volatile memory die. In one embodiment, each memory die in the memory packages 104 utilize NAND flash memory (e.g., two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126 connected along bus 128. Host memory 124 is the host's physical memory, and can be DRAM, SRAM, non-volatile memory or another type of storage. In one embodiment, host 120 is external to and separate from memory system 100. In another embodiment, memory system 100 is embedded in host 120.

Figure 2:
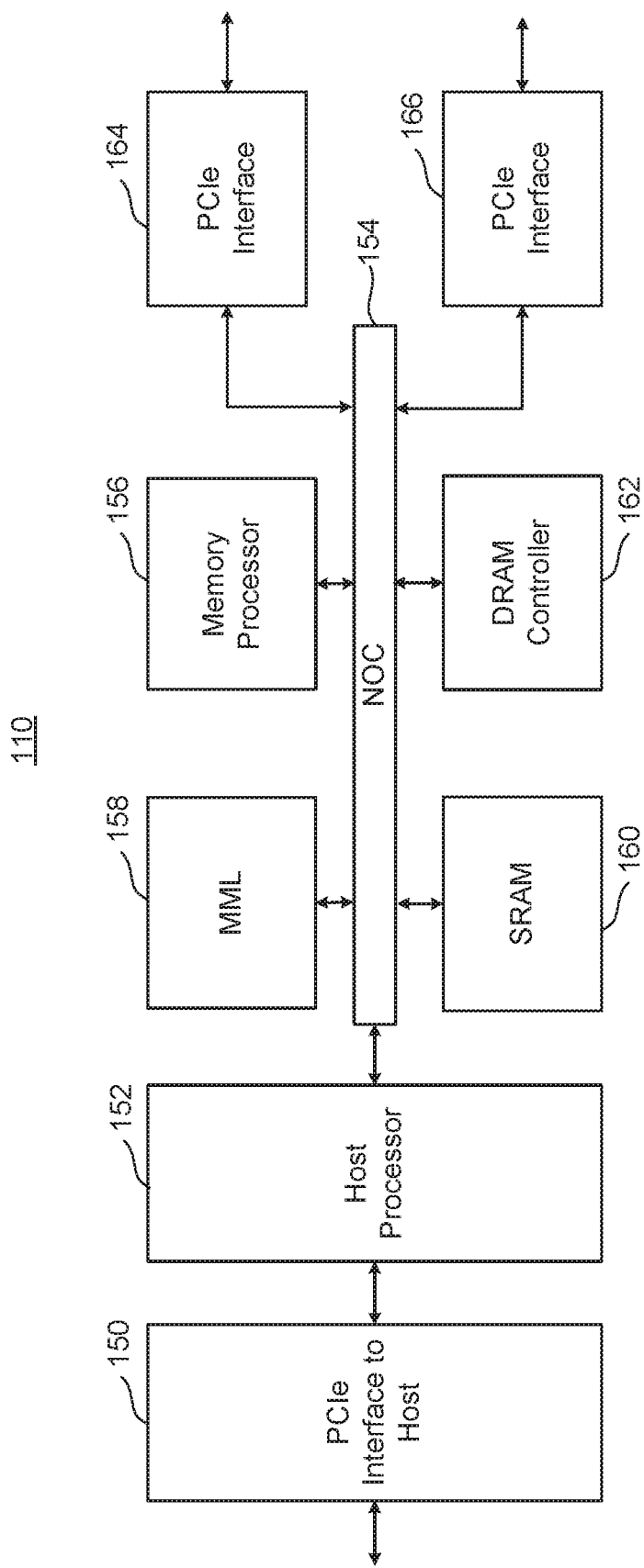
FIG. 2 is a block diagram of one embodiment of a Front End Processor Circuit. In some embodiments, the Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface 150. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOCs can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC 154 are shared by many signals. A high level of parallelism is achieved because all links in the NOC 154 can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is a memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also, in communication with the NOC 154 are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

FEP circuit 110 can also include a Flash Translation Layer (FTL) or, more generally, a Media Management Layer (MML) 158 that performs memory management (e.g., garbage collection, wear leveling, load balancing, etc.), logical to physical address translation, communication with the host, management of DRAM (local volatile memory) and management of the overall operation of the SSD or other non-volatile storage system. The media management layer MML 158 may be integrated as part of the memory management that may handle memory errors and interfacing with the host. In particular, MML 158 may be a module in the FEP circuit 110 and may be responsible for the internals of memory management. In particular, the MML 158 may include an algorithm in the memory device firmware which translates writes from the host into writes to the memory structure (e.g., 326 of FIG. 5A below) of a die. The MML 158 may be needed because: 1) the memory may have limited endurance; 2) the memory structure may only be written in multiples of pages; and/or 3) the memory structure may not be written unless it is erased as a block. The MML 158 understands these potential limitations of the memory structure which may not be visible to the host. Accordingly, the MML 158 attempts to translate writes from the host into writes into the memory structure.

Figure 3:
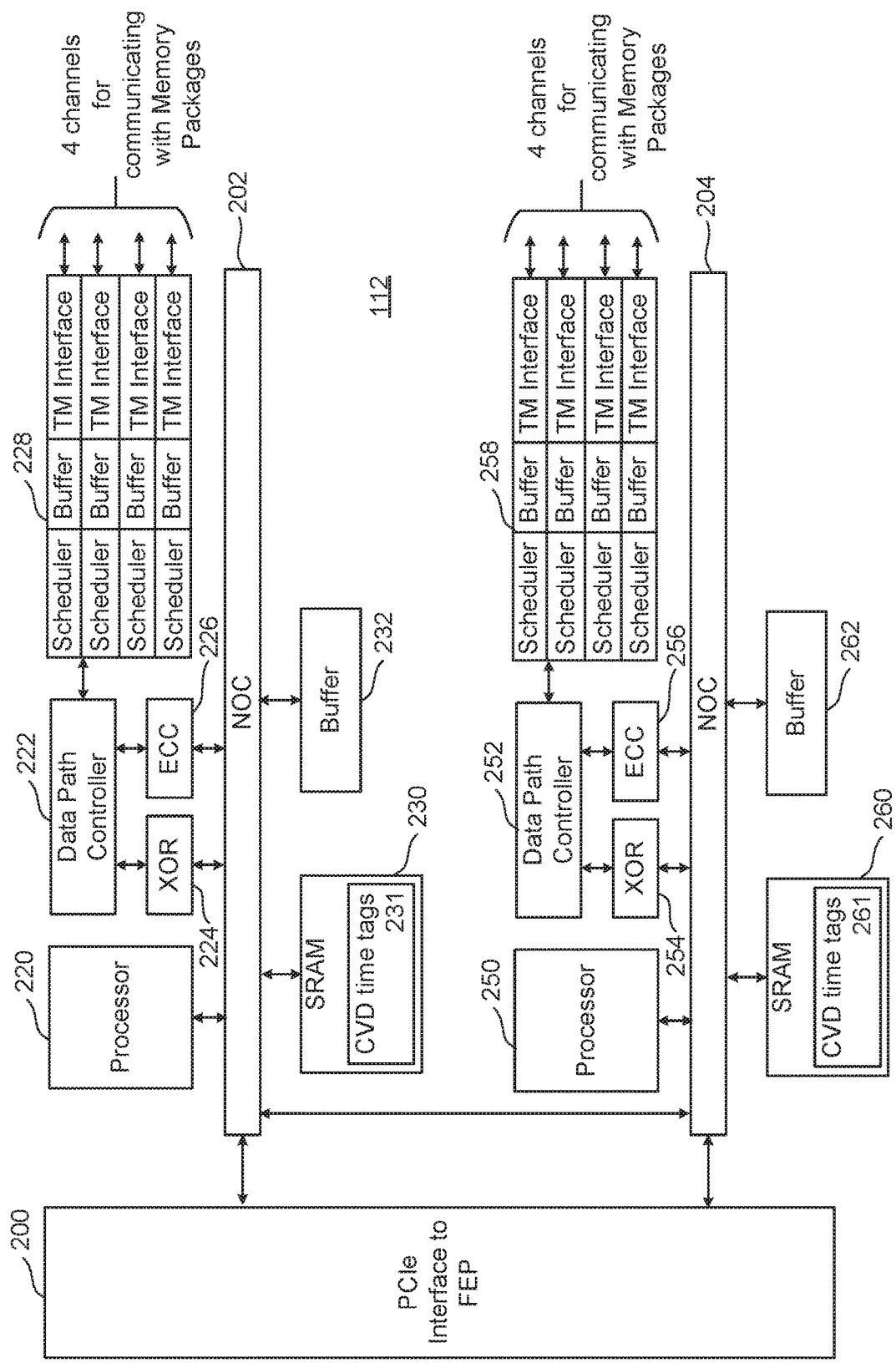
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined into one large NOC. Each NOC (202/204) is connected to SRAM (230/260), a buffer (232/262), a processor (220/250), and a data path controller (222/252) via an XOR engine (224/254) and an ECC engine (226/256). The ECC engines 226/256 are used to perform error correction, as known in the art. SRAM 230/260 is local RAM memory used by memory processor 220/250 and can store system data such as the CVD time tags 231/261, that are discussed further below. The XOR engines 224/254 are used to XOR the data so that data can be combined and stored in a manner that can be recovered in case there is a programming error. Data path controller 222 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. In certain embodiments, the XOR engines 224/254 and ECC engines 226/256 are dedicated hardware circuits, known as hardware accelerators. In other embodiments, the XOR engines 224/254 and ECC engines 226/256 can be implemented in software. Embodiments of the ECC engines 224/254 are discussed further below, with respect to the use of "vertical ECC". The scheduler, buffer, and TM Interfaces are hardware circuits.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g., FIG. 3). In some embodiments, the memory package 104 can include a small controller connected to the memory bus and the TM Interface. The memory package 104 can have one or more memory die 292. In one embodiment, each memory package 104 includes eight or 16 memory die; however, other numbers of memory die can also be implemented. The technology described herein is not limited to any particular number of memory die.

Figure 5A:
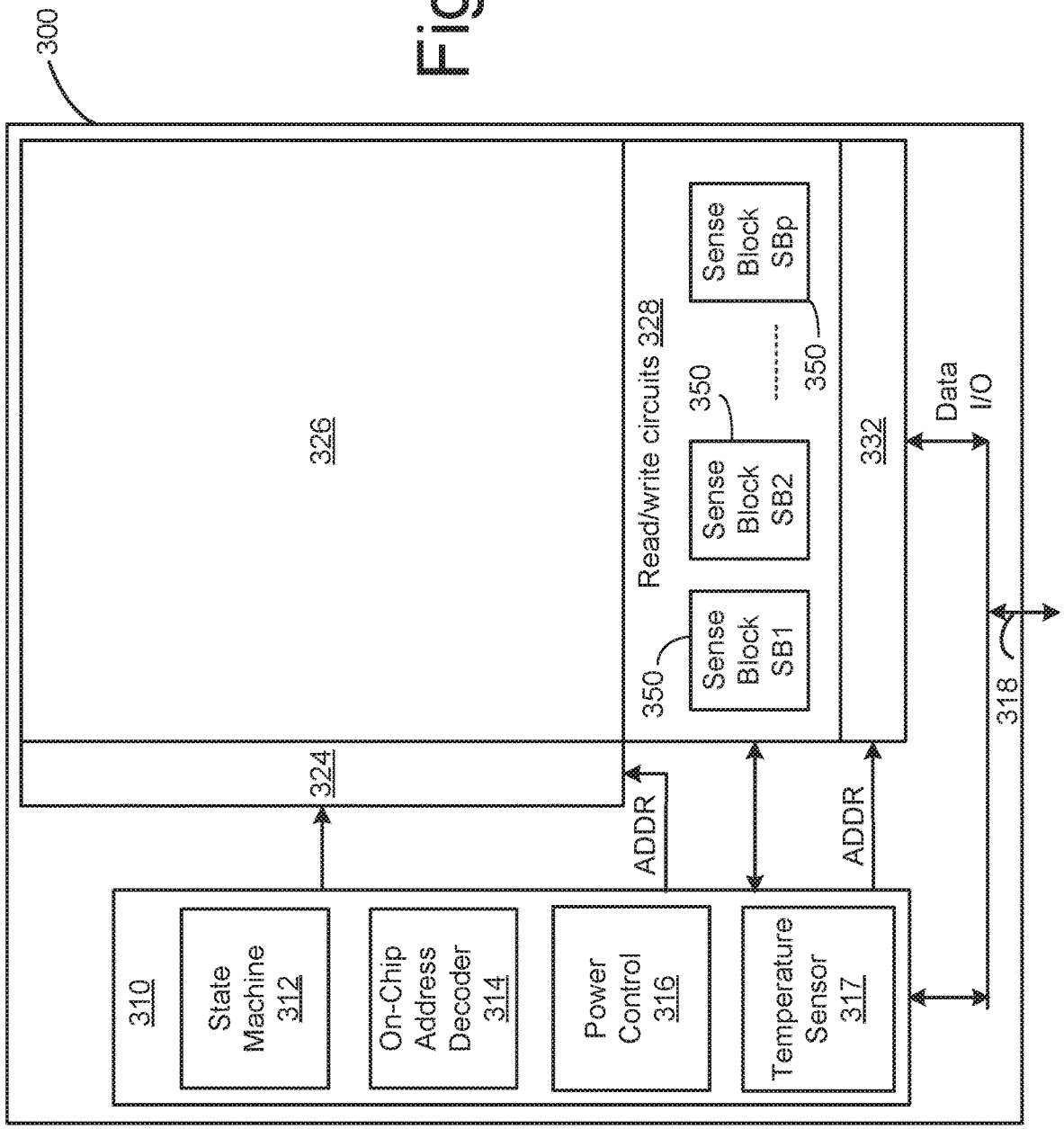
FIG. 5A is a block diagram of one embodiment of a memory die.

FIG. 5A is a functional block diagram of one embodiment of a memory die 300 (e.g., the memory die 292 in FIG. 4). The components depicted in FIG. 5A are electrical circuits. In one embodiment, each memory die 300 includes a memory structure 326, control circuitry 310, and read/write circuits 328. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller 102 (in FIG. 1) and the memory die 300 via lines 318. In one embodiment, memory die 300 includes a set of input and/or output (I/O) pins that connect to lines 318.

Control circuitry 310 cooperates with the read/write circuits 328 to perform memory operations (e.g., write, read, and others) on memory structure 326, and includes a state machine 312, an on-chip address decoder 314, a power control circuit 316, and a temperature sensor circuit 317. State machine 312 provides die-level control of memory operations. In one embodiment, state machine 312 is programmable by software. In other embodiments, state machine 312 does not use software and is completely implemented in hardware (e.g., electrical circuits). In another embodiment, state machine 312 is replaced by a micro-controller. In one embodiment, control circuitry 310 includes buffers such as registers, ROM fuses and other storage devices for storing default values such as base voltages and other parameters. Temperature sensor circuit 317 detects current temperature at memory die 300.

The on-chip address decoder 314 provides an address interface between addresses used by the Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

For purposes of this document, the phrase "one or more control circuits" refers to a controller (e.g., 102), a state machine (e.g., 312), a micro-controller and/or control circuitry (e.g., 310), or other analogous circuits that are used to control non-volatile memory.

In one embodiment, memory structure 326 comprises a three dimensional memory array of non-volatile memory cells in which multiple memory levels are formed above a single substrate, such as a wafer. The memory structure 326 may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store data. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 5B:
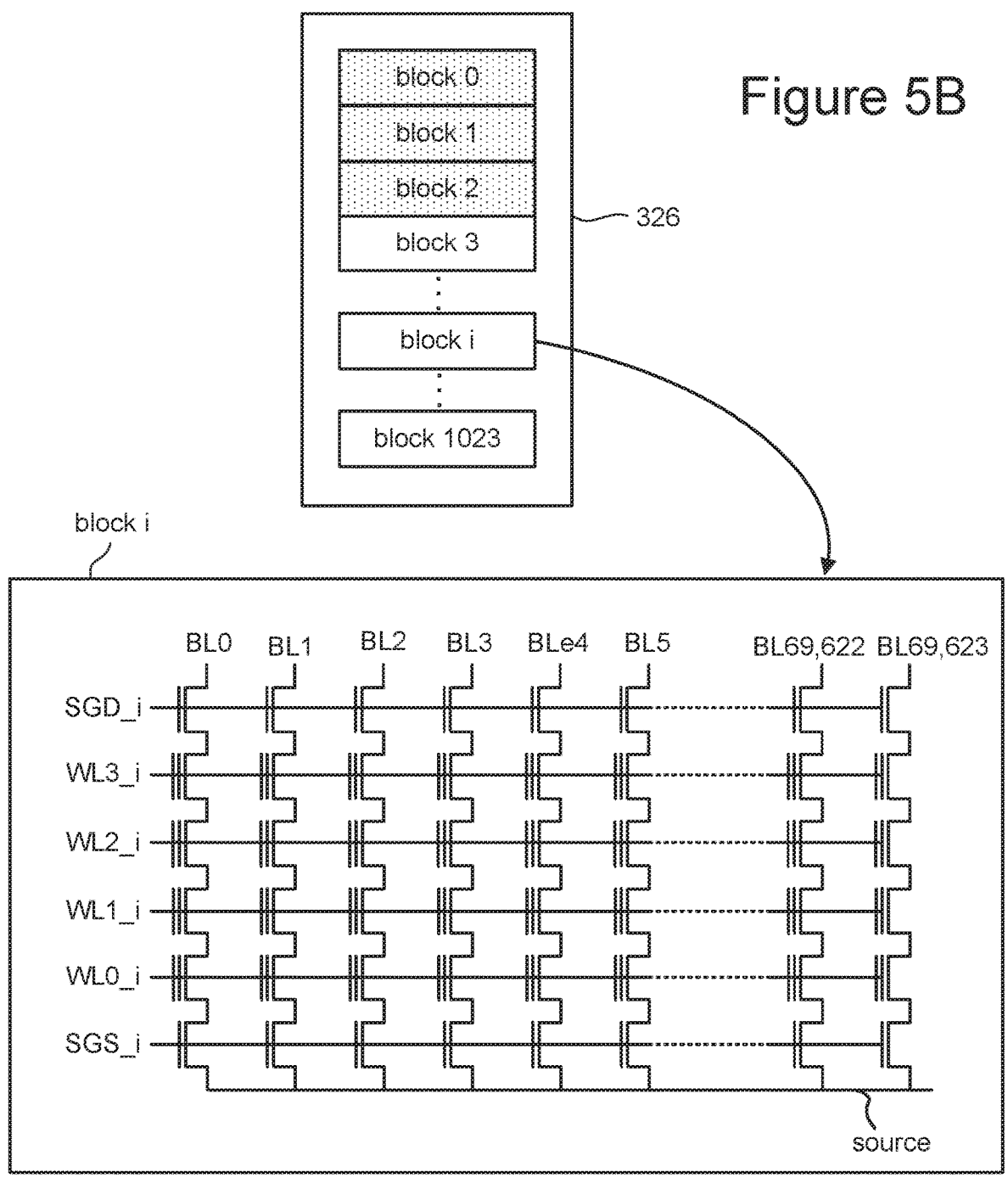
FIG. 5B depicts an exemplary structure of a memory cell array.

FIG. 5B depicts an exemplary structure of memory structure 326. In one embodiment, the memory structure 326 includes an array of memory cells that is divided into a large number of blocks of memory cells. As is common for flash EEPROM systems, each block is the unit of erase. That is, each block contains the minimum number of memory cells that are erased together. Other embodiments can use different units of erase. The blocks can be grouped into sets of blocks, such as blocks of particular region of the memory structure 326. For example, the stippled region of blocks (block 0, block 1, and block 2) can be a set of blocks, where the use of sets of blocks is relevant in the discussion given below for the read scan process discussed with reference to FIGS. 13 and 14.

As one example, FIG. 5B depicts a NAND flash EEPROM that is partitioned into 1,024 blocks. However, more or less than 1024 blocks can be used. In each block, in this example, there are 69,624 columns corresponding to bit lines BL0, BL1, . . . BL69,623. In one embodiment, all of the bit lines of a block can be simultaneously selected during read and program operations. Memory cells along a common word line and connected to any bit line can be programmed (or read) at the same time (e.g., concurrently). In another embodiment, the bit lines are divided into even bit lines and odd bit lines. In an odd/even bit line architecture, memory cells along a common word line and connected to the odd bit lines are programmed at one time, while memory cells along a common word line and connected to even bit lines are programmed at another time.

FIG. 5B shows four memory cells connected in series to form a NAND string.

Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. One or more pages of data are typically stored in one row of memory cells. A page can store one or more sectors. A sector includes user data and overhead data. Overhead data typically includes an Error Correction Code (ECC) that has been calculated from the user data of the sector. The controller 102 calculates the ECC when data is being programmed into the array structure 326, and also checks it when data is being read from the array. In some embodiments, the state machine 312, controller 102, or other component can calculate and check the ECC. In some alternatives, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. In one embodiment, each word line of a block is associated with one page. In another embodiment, each word line of a block is associated with 3 pages. In other embodiments, the word lines can be associated with other numbers of pages.

Figures 6A, 6B, 7:
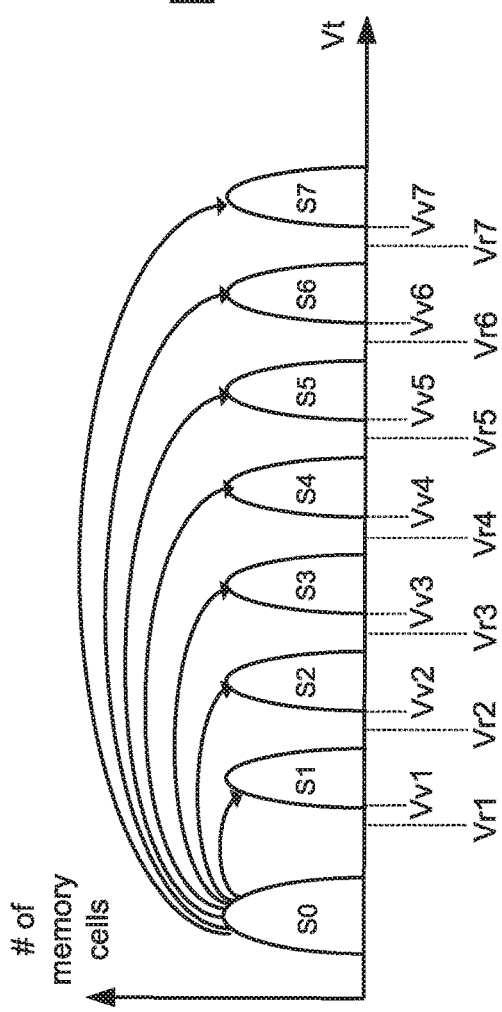
FIG. 6A depicts threshold voltage distributions.
FIG. 6B is a table describing one example of an assignment of data values to data states.
FIG. 7 is a schematic representation of some of the metadata information that can be included for groups of blocks.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 6A illustrates example threshold voltage distributions for a memory array when each memory cell stores three bits of data. Other embodiments, however, may use other data capacities per memory cell (e.g., such as one, two, four, or five bits of data per memory cell). FIG. 6A shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 6A shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 6A also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 6A represent the full sequence programming. The technology described herein can also be used with other types of programming in addition to full sequence programming (including, but not limited to, multiple stage/phase programming). In some embodiments, data states S1-S7 can overlap, with controller 102 relying on error correction to identify the correct data being stored. The use of error correction and the overlapping of distributions is discussed in more detail below with respect to FIG. 9.

FIG. 6B is a table describing one example of an assignment of data values to data states. In the table of FIG. 6B, S0=111. S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6B, all bits stored in a memory cell are 1 when the memory cells are erased (e.g., in data state S0).

On a memory structure, such as 326 of FIGS. 5A and 5B, the behavior of the device may vary over time and also vary based on the location within the memory structure. For example, as a device ages, it may improve memory operation if the set of verify reference voltages [Vv]=(Vv1, Vv2, Vv3, Vv4, Vv5, Vv6, Vv7) and the set of read reference voltages [Vr]=(Vr1, Vr2, Vr3, Vr4, Vr5, Vr6, Vr7) are not fixed, but can vary and be updated over time to reflect device aging. The optimal verify reference voltages [Vv] and the read reference voltages [Vr] may also differ for difference regions of the memory array or memory device, as a memory device may have different characteristics in different regions due to processing variations and layout differences.

To operate more efficiently, a memory system can maintain system data, including metadata on the user data, to be able to operate more efficiently. A common example of such metadata is the number of program/erase (P/E) cycles that each of the blocks have experience, as this information is a good indicator of the block's relative wear and can useful in managing the memory for processes such as wear leveling. In some embodiments, the system can maintain such information on the memory Cells' Voltage threshold Distributions (CVD) time tag, including operating parameters such as the Vr and Vv values for reading and verifying the different data states as illustrated in FIG. 6A. For example, the memory processor 230/260 can maintain the CVD time tag data 231/251 in the SRAM 230/260 of FIG. 3. Rather than use a fixed set of parameters, whose accuracies may change over time and not account for variations between different die or variations within a given die, maintaining separate set of parameters for different groups of blocks, such as sets of blocks corresponding to the different regions of the different die of the memory system, can allow for more accurate operation of the memory device; and rather than establishing optimized parameters for a block each time it is accessed, as in a dynamic read operation, this allows for the operating parameters to readily available, with updates only performed occasionally or when needed.

The optimal read and other operating parameters will typically vary between different memory chips or die, as well as across a given die. As assigning a CVD time tag for every block would create a very large amount of metadata overhead, in some embodiments each CVD time tag can cover a group or set of blocks (for example, 20, 30, 50 or 100 blocks) in the same area or contiguous region of a die, as memory blocks in the same regions will usually share fairly similar characteristics. In the following, a given CVD time tag will cover a range of physical block addresses corresponding to an area of a single die. FIG. 7 is a schematic representation of some of the metadata information that can be included in CVD time tag embodiments.

In the example of FIG. 7, a CVD time tag includes an ID of information identifying the physical blocks it covers, such as a range or ranges of physical block addresses, where an example of a set of blocks covered by a shared CVD time tag is represented by the stippled region of blocks 0-2 in FIG. 5B. The CVD time tag can also include a time stamp to indicate when the current parameters of a given CVD time tag was set. The parameters kept in the CVD time tag can include the set of read parameters ([Vr]) for the different states and the set of program verify parameters ([Vv]) for the different states. These can be presented as digital values that would be converted analog voltages by a digital-to-analog (DAC) conversion on the memory circuit. Other examples of parameters presented by the CVD time tag can include program parameters, such as amplitude of the initial programming pulse for each state and step size. In some embodiments, the CVD time tag can also include information on operating conditions (such as temperature) at the time of programming. The controller can keep the CVD time tags in RAM memory, such as SRAM 230/260 of FIG. 3 or SRAM 160 of FIG. 2, where they can be accessed as needed. The controller can maintain copies of the CVD time tags in non-volatile memory, from where they can be loaded to the controller's RAM at power up. The BER (bit error rate) field will be discussed in more detail below.

Figure 8:
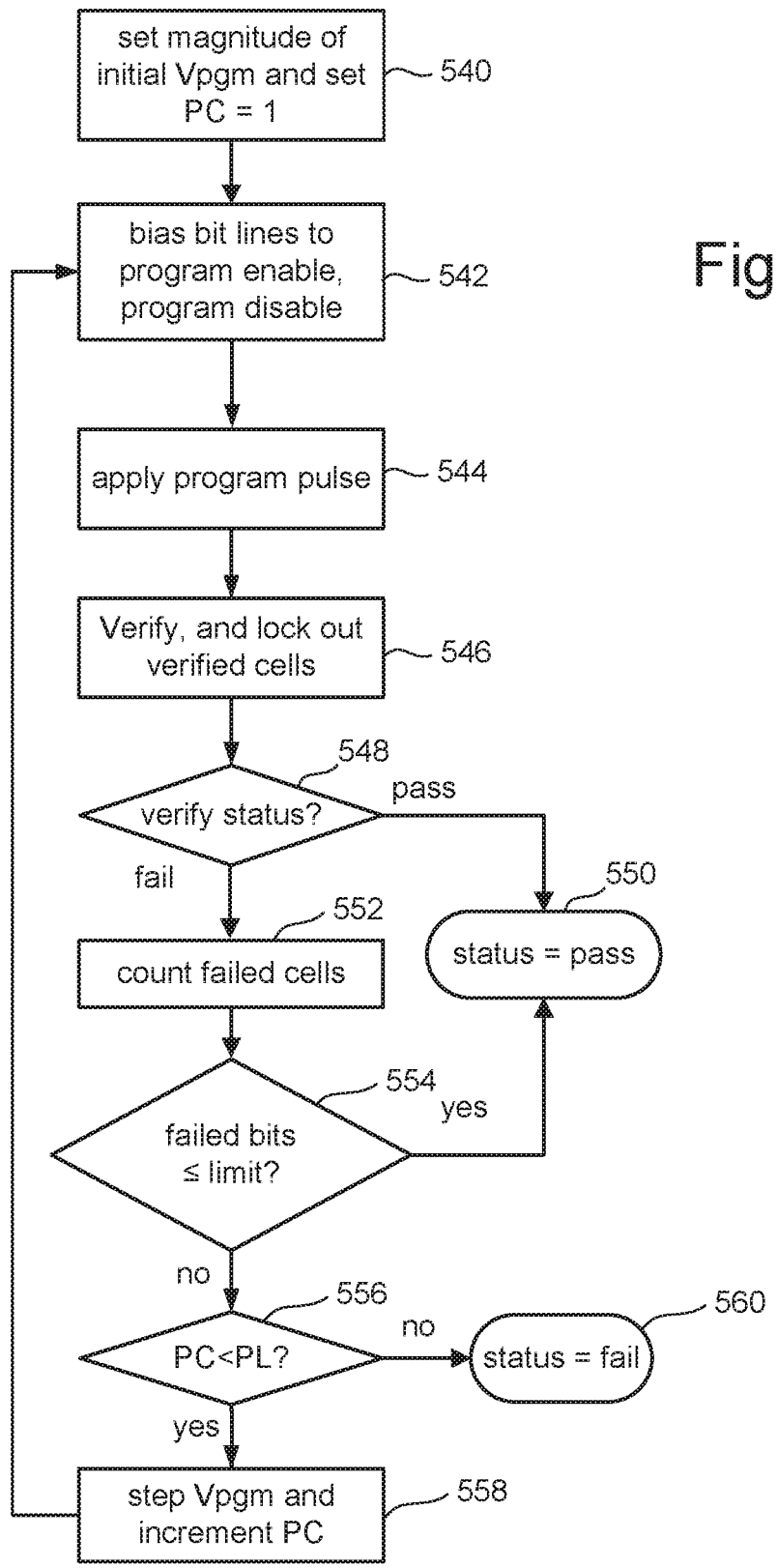
FIG. 8 is a flow chart describing one embodiment of a process for programming non-volatile memory.

FIG. 8 is a flowchart describing one embodiment of a process for programming. In one example embodiment, the process of FIG. 8 is performed on memory die 300 using the control circuit 310 discussed above. For example, the process of FIG. 8 can be performed at the direction of state machine 312. The process of FIG. 8 can also be used to implement the full sequence programming discussed above. Additionally, the process of can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 540 of FIG. 8, the programming voltage (Vpgm is initialized to the starting magnitude (e.g., ~12-16V or another suitable level) and a program counter (PC) maintained by the state machine 312 is initialized at 1.

In one embodiment, the group of memory cells selected to be programmed (referred to herein as the selected memory cells) are programmed concurrently and are all connected to the same word line (the selected word line). There will likely be other memory cells that are not selected for programming (unselected memory cells) that are also connected to the selected word line. That is, the selected word line will also be connected to memory cells that are supposed to be inhibited from programming. For example, when data is written to a set of memory cells, some of the memory cells will need to store data associated with state S0 so they will not be programmed. Additionally, as memory cells reach their intended target data state, they will be inhibited from further programming. Those NAND strings that include memory cells connected to the selected word line that are to be inhibited from programming have their channel's voltage raised, or boosted, to inhibit programming. When a channel has a boosted voltage, the voltage differential between the channel and the word line is not large enough to cause programming. At step 542 the bit lines of the NAND strings along the selected word line are biased to either a program enable or a program inhibit voltage level, depending on whether the memory cells on that NAND string for the selected word line is to be programmed or not.

In step 544, a program pulse of the program signal Vpgm is applied to the selected word line (the word line selected for programming). If a memory cell should be programmed, then the corresponding bit line is grounded. On the other hand, if the memory cell should remain at its current threshold voltage, then the corresponding bit line is connected to a program inhibit voltage to inhibit programming. As used herein, a program inhibit voltage is a voltage selected to raise the voltage level within the channel region of non-selected memory cells to a high enough voltage level so that when the program pulse is applied to the selected word line, any voltage differential generated between the channel and the control gate of a non-selected memory cell is insufficient to induce electron injection into the non-selected memory cell's charge storing region. For example, in embodiments described here a non-selected NAND string may have its corresponding bit lines biased to a program inhibit level of around 2.5V, for example, where this value can vary from around 1.5V to 3.5V or even higher depending on the embodiment.

In step 544, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming due to application of the program inhibit voltage.

In step 546, the appropriate memory cells are verified using the appropriate set of verify reference voltages to perform one or more verify operations. In one embodiment, the verification process is performed by testing whether the threshold voltages of the memory cells selected for programming have reached the appropriate verify reference voltage. For example, the verify operation can use the corresponding set of verify values [Vv] values from the CVD time tag, as discussed above with respect to FIG. 7, for embodiments using CVD time tags.

In step 548, it is determined whether all the memory cells have reached their target threshold voltages (pass). If so, the programming process is complete and successful because all selected memory cells were programmed and verified to their target states. A status of "PASS" is reported in step 550. If, in step 548, it is determined that not all of the memory cells have reached their target threshold voltages (fail), then the programming process continues to step 552.

In step 552, the memory system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 554, it is determined whether the count from step 552 is less than or equal to a predetermined limit. In one embodiment, the predetermined limit is the number of bits that can be corrected by error correction codes (ECC) during a read process for the page of memory cells. If the number of failed cells is less than or equal to the predetermined limit, than the programming process can stop and a status of "PASS" is reported in step 550. In this situation, enough memory cells programmed correctly such that the few remaining memory cells that have not been completely programmed can be corrected using ECC during the read process. In some embodiments, the predetermined limit used in step 554 is below the number of bits that can be corrected by error correction codes (ECC) during a read process to allows for future/additional errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 556 and the program counter PC is checked against the program limit value (PL). Examples of program limit values include 6, 12, 16, 20 and 30; however, other values can be used. If the program counter PC is not less than the program limit value PL, then the program process is considered to have failed and a status of FAIL is reported in step 560. If the program counter PC is less than the program limit value PL, then the process continues at step 558 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 558, the process loops back to step 542 and another program pulse is applied to the selected word line so that another iteration (steps 542-558) of the programming process of FIG. 8 is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as a read bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

After a programming operation, the memory cells will be written into well-defined distributions of threshold voltages for the different data states, such as illustrated in FIG. 6A. In practice, as discussed above with respect to step 554 of FIG. 8, a memory system will typically allow some amount of error in the programming process, as this can be handled by ECC. Because of this, some number of memory cells have threshold voltages that are outside of the distribution for their intended data states, but this number should be well within the system's ECC capabilities to allow for data error that can subsequently occur as the memory system operates over time.

In a memory array, operations on one set of selected memory cells can place a voltage differential on other, non-selected memory cells of the array. For example, referring to FIG. 5B, adjacent word lines and adjacent bit lines will have some degree of capacitive coupling. As the scale of memory devices shrink, bit lines and word line become closer to one another, and as device capacity is increased, the word lines and bit lines become longer. Both of these lead to increased capacitive coupling. Consequently, when a program pulse is applied to one word line, it may affect the data state of memory cells on nearby word lines, resulting in a program disturb. The voltage levels applied to selected memory cells in a read operation may affect nearby nonselected memory cells, leading read disturb. Similarly, erase operations can lead erase disturbs, as unselected memory blocks sharing a well region or source region with a selected block may experience the high erase voltage applied to the selected block.

The NAND structure shown in FIG. 5B can lead to disturbs. For example, in a read or program operation on a NAND structure, non-selected memory cells in a NAND string are biased to conduct when a memory cell in a shared NAND string is selected for sensing or programming. Erase operations can similarly place strains on the memory cells of an array. Over time, these stresses lead to read, write, or erase induced disturbs on the memory cells that can shift their threshold voltages. Even without these stresses, the charge storage regions of the memory cells can leak charge over time. This will lead to the well-defined, separated state distributions (e.g., illustrated in FIG. 6A) to spread.

Figures 9, 10:
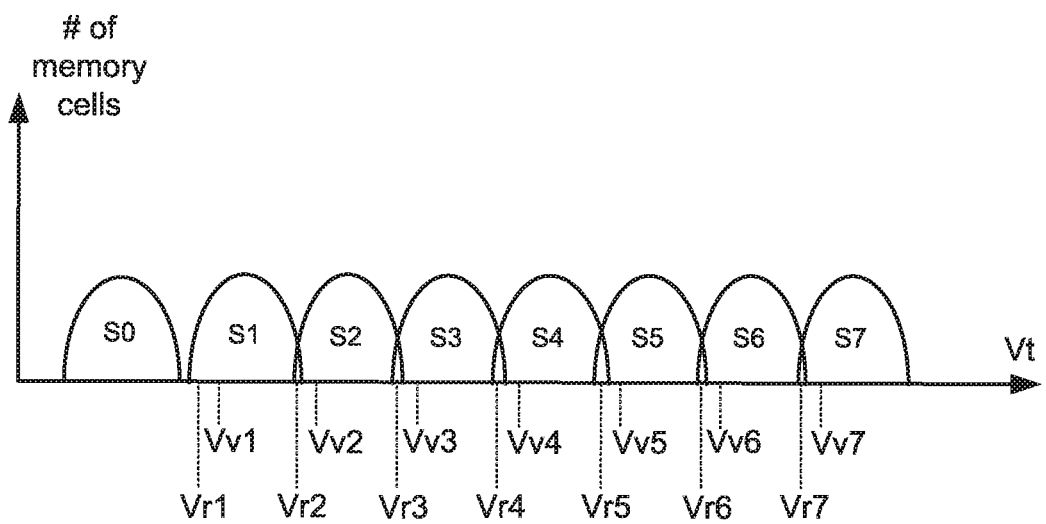
FIG. 9 illustrate the distributions of FIG. 6A at a later time, when they have spread from the freshly programmed distributions illustrated in FIG. 6A.
FIG. 10 represents a page of data formed of multiple ECC codewords.

FIG. 9 illustrate the distributions of FIG. 6A at a later time, when they have spread from the freshly programmed distributions illustrated in FIG. 6A. As shown in FIG. 9, the tails of one distribution can begin to overlap with the tails of neighboring distributions. For instance, looking at the S1 and S2 distributions, these now overlap, with some of the memory cells programmed to state S2 now having threshold values below Vr2, causing them to be read as belonging to state S1, and with some of the memory cells programmed to state S1 now having threshold values above Vr2, causing them to be read as belonging to the state S2. To correct for such error, memory systems frequently employ error correction code (ECC) techniques.

Because it is possible that errors can occur when programming, reading, or erasing data, and errors can occur while storing data (e.g., due to electrons drifting, data retention issues or other phenomenon), error correction is used with the programming of a page of data. Memory systems often use ECC to protect data form corruption. Many ECC coding schemes are well known in the art. These conventional error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as ½). Examples of well-known ECC codes commonly used in connection with flash memory storage include Reed-Solomon codes, other Bose, Chaudhuri, and Hocquenghem (BCH) codes, Hamming codes, and the like. Sometimes, the error correction codes used in connection with flash memory storage are "systematic," in that the data portion of the eventual codeword is unchanged from the actual data being encoded, with the code or parity bits appended to the data bits to form the complete codeword.

The particular parameters for a given error correction code include the type of code, the size of the block of actual data from which the codeword is derived, and the overall length of the codeword after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512 byte sector of data, using about 72 ECC bits. In the flash memory context, error correction coding provides substantial improvement in manufacturing yield, as well as in the reliability of the flash memory over time.

In some embodiments, the Controller 102 receives host data, also referred to as information bits, that is to be stored non-volatile three dimensional memory structure 326. The informational bits are represented by the matrix i=[1 0] (note that two bits are used for example purposes only, and many embodiments have codewords longer than two bits). An error correction coding process (such as any of the processes mentioned above or below) is implemented in which parity bits are added to the informational bits to provide data represented by the matrix or codeword v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes are typically applied to multiple pages encoded across a number of storage elements, but they do not need to be applied across multiple pages. The data bits can be mapped to a logical page and stored in the storage structure 326 by programming one or more memory cells to one or more programming states, which corresponds to the matrix or codeword v.

FIG. 10 is a schematic representation of a page of data, the page formed of multiple codewords CW1, CW2, . . . , CWn. Each code word CWi includes a user data portion DATAi and an ECC portion ECCi with ECC data corresponding to the user data of the codeword. When forming up pages of data to store in the memory structure 326, the controller will form up ECC codewords by breaking up the data into chunks and, for each chunk, generating the corresponding ECC by the ECC engine 226/256. Each chunk of data and its corresponding ECC is formed into an ECC codeword and the ECC codewords are then formed into pages. The pages are transferred to be written into the memory structure 326, where, to take the 3-bit per cell example describe with respect to FIGS. 6A and 6B, three of these pages of data are written to each word line or physical page.

In one possible implementation, an iterative probabilistic decoding process is used when reading data which implements error correction decoding corresponding to the encoding implemented in the Controller 102 (see ECC engine 226/256). Further details regarding iterative probabilistic decoding can be found in the above-mentioned D. MacKay text. The iterative probabilistic decoding attempts to decode a codeword read from the memory by assigning initial probability metrics to each bit in the codeword. The probability metrics indicate a reliability of each bit, that is, how likely it is that the bit is not in error. In one approach, the probability metrics are logarithmic likelihood ratios (LLRs) which are obtained from LLR tables. LLR values are measures of the reliability with which the values of various binary bits read from the storage elements are known.

The LLR for a bit is given by:

$$Q = \log_2 \frac{P(v=0\mid Y)}{P(v=1\mid Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a codeword. Further, the LLR tables can account for the multiple read results so that an LLR of greater magnitude is used when the bit value is consistent in the different codewords.

Controller 102 receives the codeword CW1 and accesses the LLRs and iterates in successive iterations in which it determines if parity checks of the error encoding process have been satisfied. If all parity checks have been satisfied, the decoding process has converged and the codeword has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the codeword, if applicable, once the parity check in question has been satisfied. In others, the process moves to the next parity check, looping back to the failed check at a later time. The process continues in an attempt to satisfy all parity checks. Thus, the decoding process of CW1 is completed to obtain the decoded information including parity bits v and the decoded information bits i.

Figure 11:
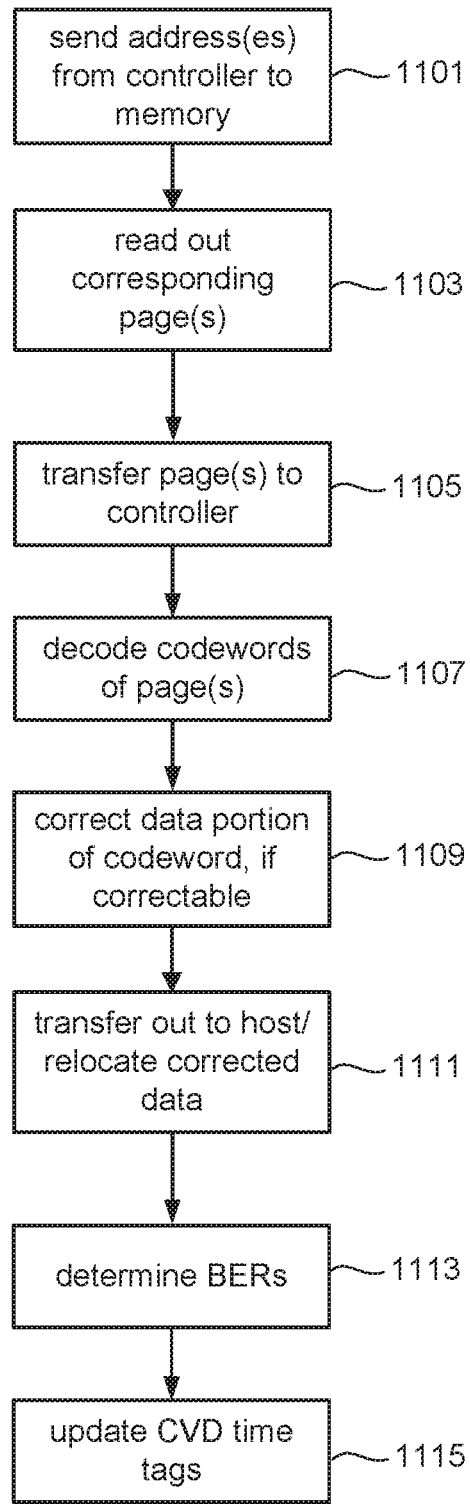
FIG. 11 is a flow chart describing one embodiment for reading out and correcting data using ECC.

FIG. 11 is a flow chart describing one embodiment for reading out and correcting data using ECC. At step 1101, the controller 102 sends a read command for one or more pages of data to the one of the memory die of memory packages 104. The read request can be a request by the host 120 for reading data or an internal request originating with the controller 102, such as for a refresh operation or a read scan. Embodiments for read scan operations are discussed in more detail below. At step 1103, the addressed memory die, such as a die 300 on one of memory packages 104, reads out the requested page or pages. For example, in the 3-bit per cell embodiment illustrated in FIG. 6A, the read operation can be performed by the sense blocks 350 including SB1, SB2, SBp of read/write circuits 328 using the read reference voltages, [Vr]=Vr1, Vr2, Vr3, Vr4, Vr5, Vr6, and Vr7. For embodiments using a CVD time tag as illustrated with respect to FIG. 7, the set of [Vr] values can be obtained from the corresponding CVD time tag. At step 1105, the read pages are transferred from the memory die of memory packages 104 to the controller 102. In the case where multiple pages are being read, these steps and the subsequent steps can be performed sequentially for a series of requested pages.

Once a page of data is at the controller 102, at step 1107 the codewords of the page are decoded by the ECC engine 226/256 as described above. Based on the ECC data of a code word, the corresponding user data is corrected at step 1109, if the amount of error does not exceed the error correction capacity of the ECC used. Once the requested data has been extracted, at step 1111 the data is transferred out to the host 120, if the data was in request to a host read, or put to the use for which the controller 102 requested it if the request was internal. For example, if the controller 102 requested the data for a refresh operation, the read and corrected data would be re-written back into one of the memory die 300 of memory packages 104. If the amount of error in a codeword is uncorrectable, the controller may issue an error status, attempt further error correction measures, or both.

As part of the process of decoding the codewords and extracting their data content, the ECC engine 226/256 may also determine bit error rates for the pages read at step 1113. This information can be accumulated, as can other information varying the read and verify voltage sets [Vr] and [Vv] that provide better results, to update CVD time tag parameter at step 1115. Varying of these sensing parameters and updating the CVD time tag is discussed further below with respect to FIG. 12.

Through use of ECC and other techniques, such as the varying the set of [Vr] values, the memory system is designed to tolerate some amount of error. The amount of error a system can tolerate is dependent upon the "strength", or capability, of the ECC arrangement used. Stronger ECC allows for more error, but with the tradeoff of lower performance and the need to store more ECC data, reducing the capacity available for user data. To avoid the amount of error overwhelming the systems capabilities, and the resultant loss of data, memory systems can perform refresh operations to restore degraded data. In a refresh operation, a data set is read, corrected, and rewritten, restoring the data's quality.

The likelihood of error to occur in the memory cells of an array can vary from location to location. The amount of error for a block or other set of memory cells, or bit error rate, can depend on the time since the block was written, as the longer the time since a block was written, the more time over which the data can degrade. The amount of error is also affected by the amount of activity in or near the block, as this can induce data disturbs: for example, if data of a particular block is frequently read, this will lead to a higher rate of read disturb. The BER of a block can also depend on the physical characteristics of a block, with some block more prone to error due to processing variations or other physical properties. Consequently, to more efficiently reduce the error of a memory array, the system can target these blocks suffering from a high bit error rate.

To determine blocks with a high bit error rate, the memory system can perform a read scan of the memory by going through the memory and checking the data quality, or health, of the blocks in order to find blocks that should be refreshed. As used herein, the data quality or health of a block refers to a measure of how well-defined the distributions of the different data states are, such as can be determined by the bit error for a block or other techniques, such as performing read operations using shifted Vr values. Read scan can be routinely used for monitoring the health of the blocks in a memory system, such as Solid-State Drive (SSD) system, by checking all of a system's block for error. To make sure all blocks are checked, a typical scan algorithm is based on a round robin algorithm where the user blocks are scanned sequentially in a fixed order, such as from the first physical block address to the last physical block address. However, this is not efficient arrangement as there could be intrinsic block bit error rate (BER) difference among these blocks and the more vulnerable blocks may or may not be able to be scanned in time. This is particularly true of high capacity memory, such as SSDs, as a full scan of this large a memory requires very large amounts of data to be read and checked, such as by transferring the ECC encoded data to the controller where it can be decoded and checked for error. If a vulnerable block is not scanned and handled before it is read by the host, higher BER may incur and the memory may suffer performance or even reliability consequences. To improve upon this situation, the following presents an efficient solution to this problem by targeting the scan read onto the blocks that belong to contiguous regions characterized by high BER.

Referring back to FIG. 7 the CVD time tags can also include a field with information on the BER (or other value indicating data quality or health) of its corresponding set of blocks. In some embodiments, this BER field may be a range of BER values for the set of blocks corresponding to a given CVD time tag or an estimate of an average value for the corresponding set of blocks. The BER field can be updated over time during memory operations and used to determine whether the operating parameters, such as the Vr values, need updating. As described in the following embodiments, the BER field can also be used to order memory blocks for a read scan operation.

Figure 12:
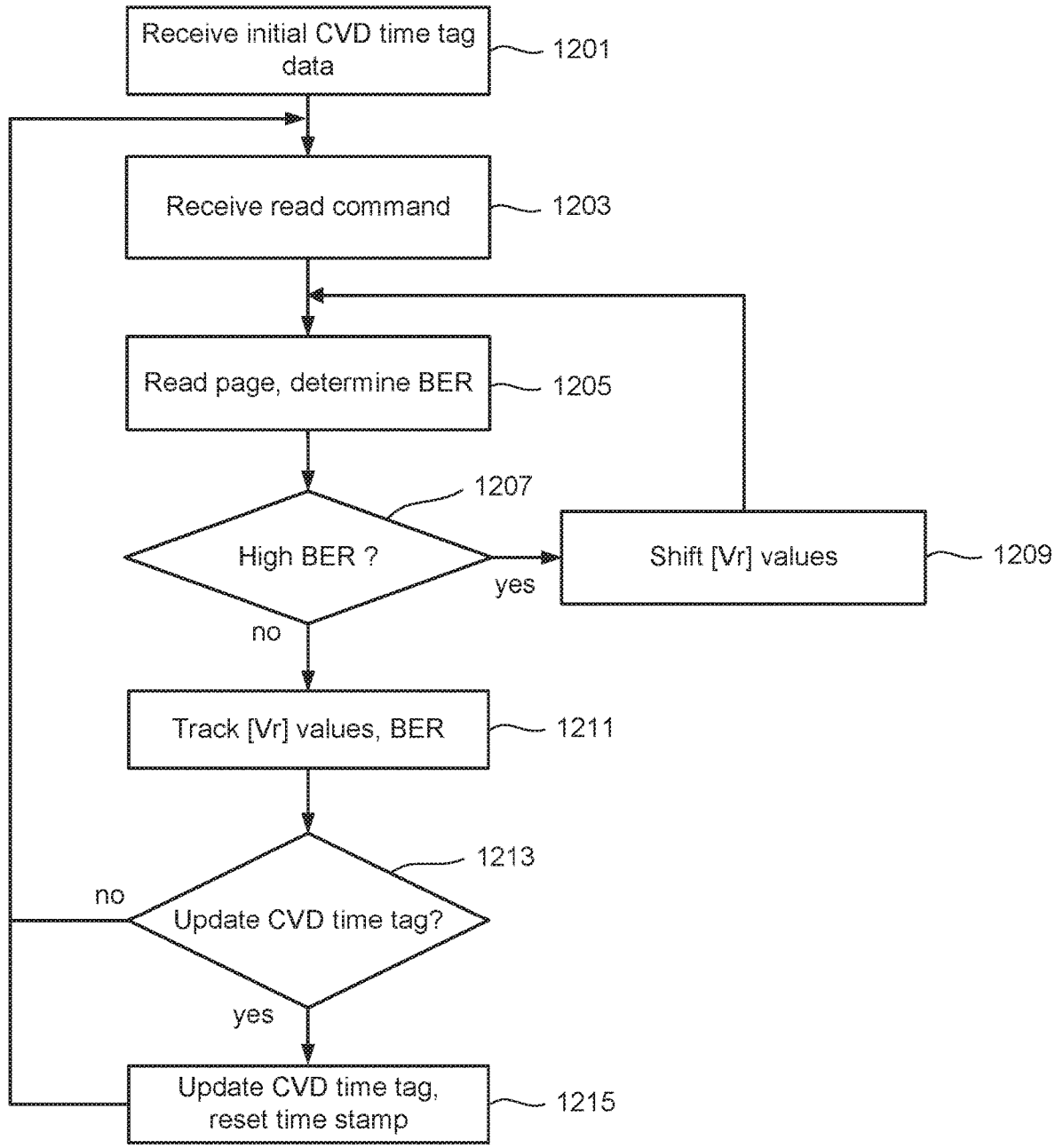
FIG. 12 is a flow chart describing one embodiment of maintaining CVD time tags.
Figure 13:
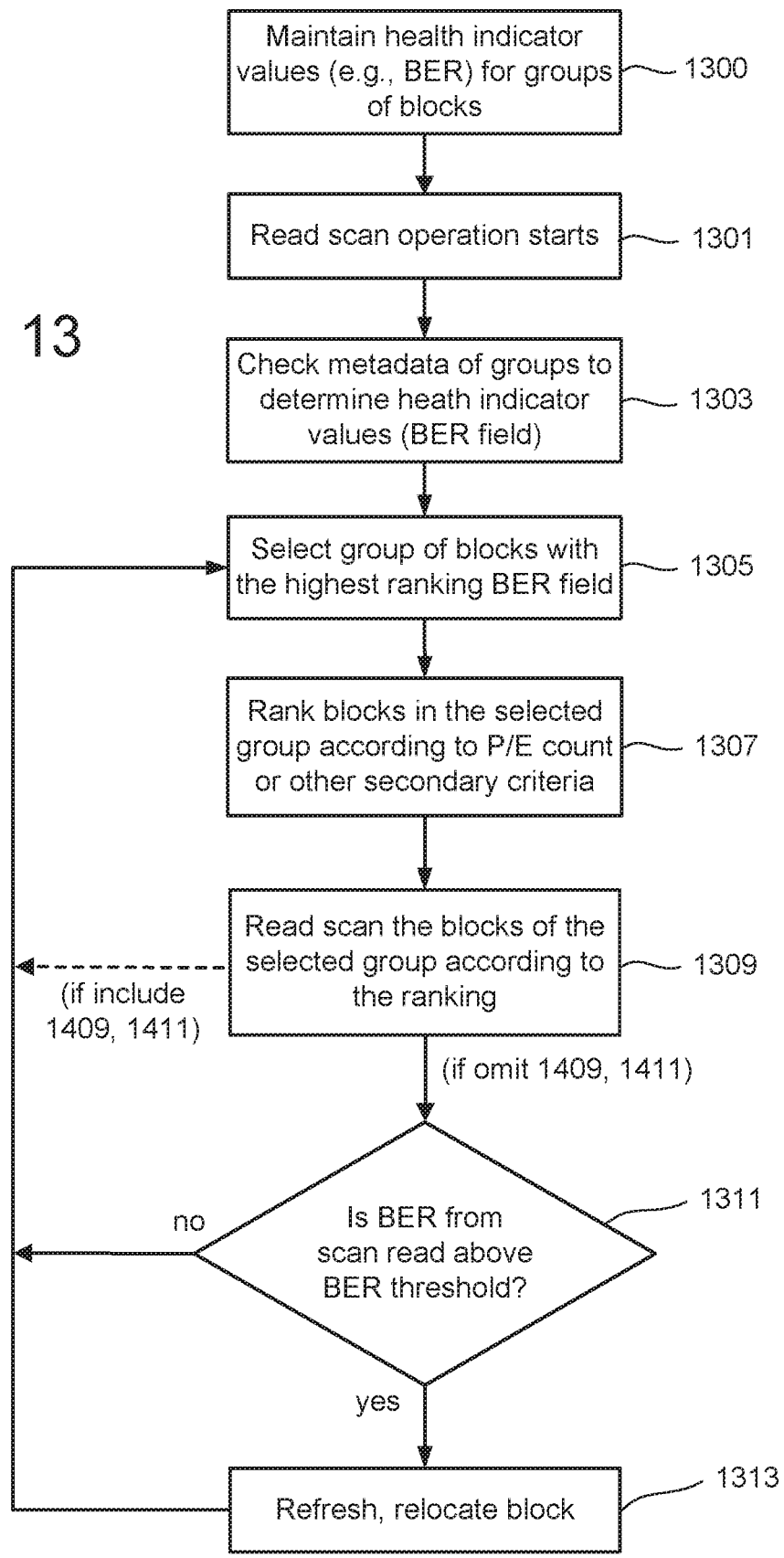
FIG. 13 is a flow chart describing one embodiment of a read scan process.

FIG. 12 is a flow chart describing one embodiment of the updating the CVD time tags (as in step 1115 of FIG. 11) and maintaining a BER estimate or range for groups of blocks, which can be used in a read scan process (as in step 1300 of FIG. 13). In particular, FIG. 12 considers the monitoring of the read reference voltages [Vr] and the BER field of the CVD time tag. Beginning at step 1201, the initial setting of the CVD time tags of the memory system is performed. These can include the device parameter values discussed above with respect to FIG. 7 and, depending on the embodiment, can be a common set of initial values used for all block sets of the memory system based on testing and device characterization or can be individually trimmed for the individual die or regions/sets of block within the die as part of a test process for fresh devices before they are shipped out. When the device is subsequently in use, the system can subsequently monitor operation and update these parameters.

As step 1203, the memory die 300 receives a read command from the controller 102. At step 1205 the requested page is read. The read is performed using the read reference parameters [Vr] of the current CVD time tag corresponding to region or set of blocks to which the word line belongs. As discussed above with respect to FIG. 10, data is read in pages, where a page is made up of codewords. When the page is read, the ECC engine 226/265 is used to decode the codewords. As part of this process, the bit error rate (BER) can be determined, as discussed above with respect to step 1113 of FIG. 11. Step 1207 determines whether this BER is overly high, e.g., by comparing the BER to a threshold.

When the system sees a high BER on a word line during a read operation, the controller can shift the [Vr] values at step 1209 to try to optimize the read reference values of [Vr]. The determination can be based on a threshold amount of error that is below the maximum amount of error that the ECC engines 226/256 can handle, where the maximum amount of tolerable error will depend the type of ECC algorithm used and its strength. By shifting the read reference voltages, a more accurate read may be obtainable. In some cases, data that is not readable with the current parameter values may be readable if [Vr] values are shifted. After shifting the [Vr] values at step 1209, the flow loops back to 1205 to read the word line with the shifted values. Once the read value passes at step 1207, the flow moves on to step 1211. The loop of steps 1207, 1209, and 1205 may be iterated several times, where if the read still does not pass after some number of iteration and the system cannot recover the date through other system features (such as the XOR blocks 224/254), the read result is reported as an uncorrectable ECC (UECC) result.

During step 1207 and any required loops back through steps 1209 and 1205, the system can monitor the shifts to the [Vr] and the BER values at step 1211. The CVD time tag holding the [Vr] values corresponds to a set of multiple memory blocks, often a region adjacent blocks of a memory die as illustrated by the stippled blocks block 0, block 1 and block 2 of FIG. 5B. In monitoring the [Vr] and BER values at step 1211, the memory system can determine whether to update the corresponding CVD time tag at step 1213. This decision can be based on the [Vr] values determined in the loop of steps 1207, 1209 and 1205 showing a significant shift from the current values, the current estimate for the BER of the group appearing to differ significantly from the BERs found at step 1205, shifts in other parameters maintained in the CVD time tag, the time stamp being old, or some combination of these and other factors. If the decision at 1213 is not to update the CVD time tag, the flow loops back to 1203 for a subsequent read command.

If the CVD time tag is to be updated, this is done at step 1215. By monitoring the [Vr] values across a number of word lines and any shifts in these values in the loop of 1207, 1205 and 1205, the [Vr] value in the CVD time tag for the set of blocks can be updated. Based on the BER values across a number of word lines at 1205, the estimated BER estimate or range of values for the corresponding set of blocks can be updated. When one or both of these parameters, or other parameters maintained in the CVD time tag, are updated, the time stamp is updated as well.

In a read scan process, rather than the read scan process working through the memory block sequentially by physical block addresses, the system can monitor the BER of the memory system by inspecting the CVD time tag IDs and checking and ranking the CVD time tags by the BER fields. After identifying the CVD time tag with the highest BER field value, the system picks the corresponding set of blocks for a read scan. Depending on the embodiment, the blocks of the selected set can be scanned sequentially based on physical block addresses or further ordered. For example, the blocks within the selected set can be further ranked based on their program/erase (P/E) count. As blocks with the lowest P/E count may have longest data retention (i.e., they may have been idle for longest), the blocks of the selected set can be ranked from lowest to highest P/E counts and, starting from the blocks with the lowest P/E count all of the blocks of the set with the highest BER field are scanned. Alternately, or additionally, other factors that can affect the BER can be used to order the blocks of a selected set: for example, temperature or other operation parameters can be used, such as the difference between the temperature at the time a block was programmed and the temperature at time of read using, for example, the temperature sensor circuit 317 on the memory die 300. Once all of the blocks of the selected set are scanned, the set of blocks corresponding to the CVD time tag with the next highest value for its BER field is picked for scanning. For any interrupting operations, such as a host read, during the read scan process, the scan can be interrupted to allow the higher priority operation to take place. Some of the elements of the memory system involved in the read scan process can be described with respect to FIGS. 1-5B and FIG. 13 is a flow chart describing one embodiment of the read scan process.

More specifically, elements of some of the elements that are relevant to the read scan process can be described by referring back to FIGS. 1-5B. FIG. 1 shows a memory system 100 having a controller 102 and memory packages 104, where a memory system will usually have more than one or more memory packages, in some cases (such as an SSD) many more, with each memory package each having one or more memory die, as illustrated in FIG. 4, of which memory die 300 in FIG. 5A is just one representative. Memory die 300 includes a memory structure 326, on-chip control circuitry 310, and read/write circuits 328. Memory structure 326 is addressable by word lines via a row decoder 324 and by bit lines via a column decoder 332. These memory die elements can be as described in more detail above with respect to the similarly numbered elements of FIG. 5A. The memory structure 326 can be formed according to various technologies described above, as well as other memory device technologies that can experience data degradation. The memory structure 326 is formed of multiple blocks as described above with respect to FIG. 5B. The blocks can be grouped into sets of blocks, such as blocks of particular region of the memory structure 326. For example, the stippled region of blocks block 0, block 1 and block 2 can be a set of blocks. Commands and data are transferred between the controller 102 and the memory die 300 via lines 318.

Figure 14:
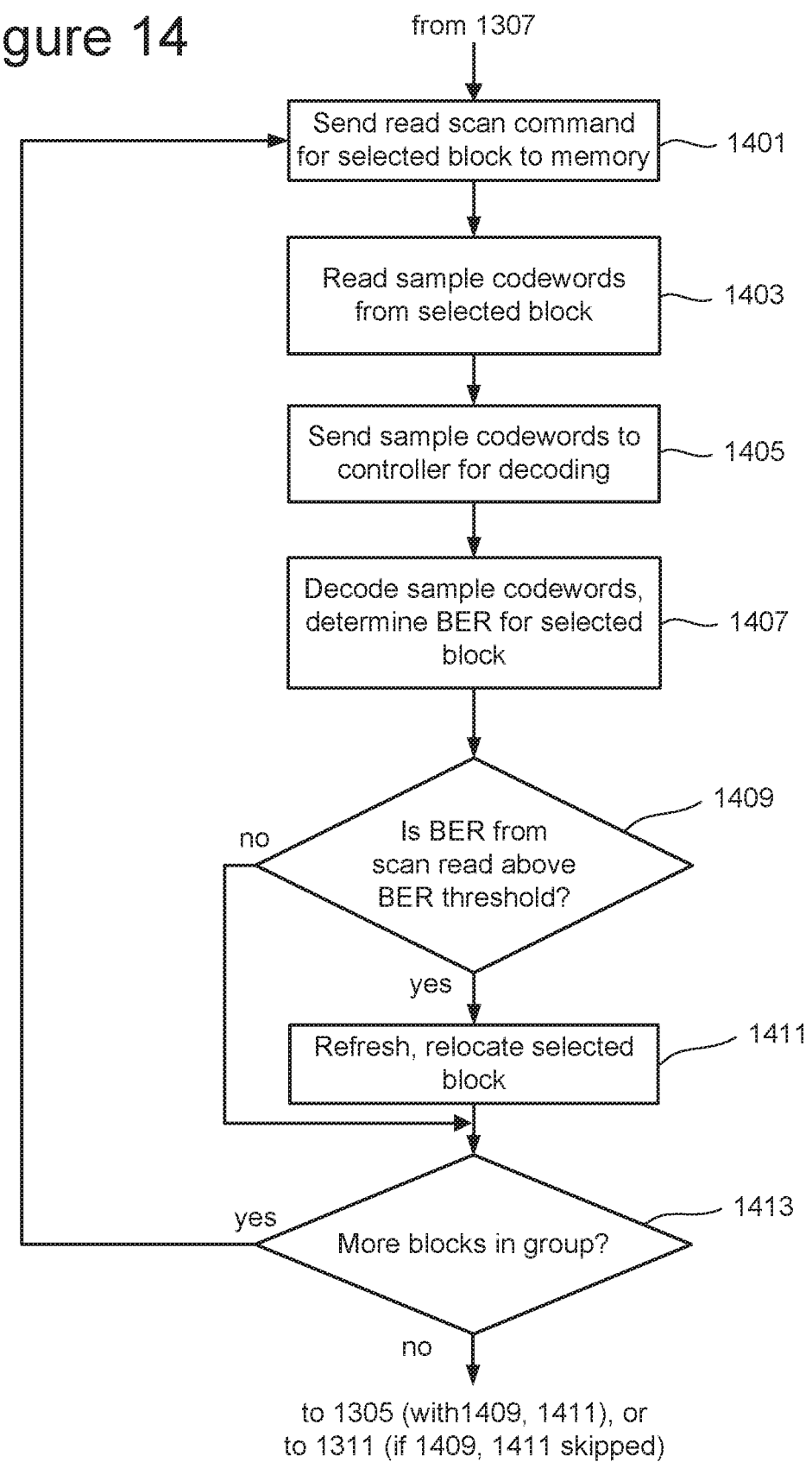
FIG. 14 is a flow chart describing one embodiment of step 1309 of the read scan process of FIG. 13.

The elements of the controller 102 referenced in the read scan flows of FIGS. 13 and 14 can include for the different memory channels memory the interface 228/258, processor 220/250, ECC engine 226/256 and SRAM memory 230/260. The processor 220/250 and ECC engine 226/256 can be as described in more detail above with respect to respective the similarly numbered elements of FIGS. 1-4. The CVD time tags used in the read scan process can be stored in SRAM memory 230/260 as CVD time tags 231/261. Depending on the embodiment, the controller 102 can store the CVD time tags in other working memory for the controller 102, such as SRAM 160 or DRAM/ReRAM 106. The controller 102, including processors 220/250, 156, and/or 152 and ECC engine 226/256, and control circuitry on the die, including on-chip controller 310, can variously form the one or more control circuits used in the read scan process to determine blocks or other segments of the memory having an amount of error above a threshold.

Referring still to the embodiments of FIGS. 1-5B, the processor 220/250 can maintain an estimate of error for regions or sets of blocks, such as the BER rate of the CVD time tags 231/261, in SRAM 230/260. Based on these estimates of error for the sets of blocks, the processor 220/250 can determine an order for the read scan the sets of blocks, as well as possibly ordering the blocks with the sets, and then send commands for the selected blocks to be read scanned. Then memory 300 then performs a scan of the requested block by reading a portion of the block, where, as described further below, this be a selected subset of the ECC codewords (CWs) stored in the block. These ECC codewords can then be sent back to the controller 102, where they can be decoded by ECC engine 226/256 to determine an amount of error for the block and, if this amount of error exceeds a threshold, the controller 102 can instruct the memory 300 to perform a refresh operation and relocate the block. This process can be described in more detail with respect to FIG. 13.

FIG. 13 is a flow chart describing one embodiment of the read scan process. Although the primary embodiments describe here looks at the read scan process being done at the block level, and in terms of groups or sets of blocks, similar techniques can be applied at other levels of granularity for the memory system. For example, for embodiments configured to allow memory operations at the partial or sub-block level, the read scan can be performed at the level of the individual sub-blocks, where the CVD time tag information can be maintained at the level of a block of multiple sub-blocks or at the multi-block level.

Prior to initiating the read scan, the memory system has been maintaining a BER range or estimate (or other health indicator value) for the diverse groups of blocks, such as the CVD time tags in the embodiments mainly described here, as represented at step 1300 and described above in more detail for one embodiment with respect to FIG. 12. The health indicator value can correspond to BER range or estimate, but, more generally, can be incorporate a number of factors, including BER, number of program/erase cycles, temperature, block decoding failure history, or combinations of these and other factors that can be used to quantify the quality with which the memory blocks maintain their data content. The controller 102 can monitor these quantities for implementation of a more general or alternate health indicator value.

The read scan operation starts at step 1301. The memory system can perform the read scan on a periodic basis or in response to criteria such as an error result, for example. At step 1303 the memory system checks the CVD time tags and their BER fields. Referring back to the embodiment of FIG. 12 for example, at step 1303 the processor 220/250 would access SRAM memory 230/260 to read the CVD time tags 231/261 and check their BER fields. The back end processor 220/250 can then rank the CVD time tags according to their BER fields at step 1305, ranking them from highest to lowest, and perform the read scan in the order of the ranking.

Each CVD time tag corresponds to a set or group of multiple blocks, which can correspond to a physical region on a memory die. The blocks within the set are then ordered by the processor 220/250 and to provide the order in which the sets of blocks will be sequentially scanned at step 1307. The ordering within the set can be based on physical address order or based on properties of the blocks, such as P/E count or operating conditions. The blocks of the set then undergo a read scan to determine the BER for each of the blocks in step 1309. Step 1309 is considered in more detail below with respect to FIG. 14. Depending on the embodiment, all of the blocks of the set corresponding to a CVD time tag can be scanned before comparing their BERs to a threshold, the individual blocks can be compared to the threshold as they are scanned and decoded, or a sub-set of the blocks can be scanned and compared before moving on to the next sub-set of blocks. FIG. 14 considers scanning and comparing the blocks of a set one by one, while FIG. 13 is for an embodiment in which all of the blocks of a set corresponding to a particular CVD time tag have their scan's BER determined before moving on for a comparison with the threshold. If FIG. 14 includes steps 1409 and 1411, steps 1311 and 1313 of FIG. 13 can be omitted. Conversely, if steps 1409 and 1411 are omitted in the flow of FIG. 14, the flow of FIG. 14 goes from the "no" path of step 1413 to step 1311 of FIG. 13.

In step 1311 the BERs of the scanned blocks are compared against a threshold value. A memory system, such as that of FIG. 12, is designed to handle a certain amount of error based on the capabilities of its ECC engine 226/256. The higher amount the tolerated error, the more robust the memory, but this requires a larger amount of ECC data, which comes at the cost of reduced storage volume for user data. Consequently, the strength of the ECC used is a design choice based on the retention capabilities of the memory and other factors. For example, if the amount of error that the ECC engine 226/256 can tolerate and still expect to decode the data is 1% for example, the threshold can be set somewhat lower at, say, a BER of 0.7%. For any blocks with a BER above the threshold at step 1311, the block is refreshed and relocated in step 1313 before looping back to step 1305. If multiple blocks are being relocated, they can also undergo garbage collection. If the BER rate is below the threshold at step 1311, the flow loops directly back to step 1305.

FIG. 14 is a flow chart describing one embodiment for step 1309 of the read scan process of FIG. 13. The embodiment of FIG. 14 includes a comparison of the blocks' BER with the threshold value for each block as they are decoded, rather than decoding all the blocks of a set corresponding a CVD time tag (as in FIG. 13) before making the comparison. In FIG. 14, step 1401 follows on from step 1307 with the sets of blocks, and the blocks within the sets, ranked in the order in which they are to be read.

At step 1401 the read scan command is sent for the highest ranked block in the currently selected set of blocks. Referring to the embodiment of FIG. 12, controller 102 would send a read scan command for the specified block to the memory die 300. On the memory die, the read scan will be performed using the read/write circuits 328, row decoder 324 and column decoder 332 circuits, and the on-chip controller 310. A read scan will typically not read all of the data in the block, but sample portions of the data as this will usually give a sufficient indication of quality of the data stored in a block, without the amount of time a full read and ECC decode would consume.

As discussed above with respect to FIG. 5B, a block is formed of a number of physical pages or word lines, each of which stores one or, for a multi-state memory, more than one logical page of data. As a (logical) page of data can be quite large, when using ECC, rather than encode a whole page of with ECC, a memory system will often break a page into smaller components and encode each of these with its own ECC into a set of ECC codewords. This structure is illustrated in FIG. 10, as discussed above.

To read out the scan data, the ECC codewords are read out of array structure 326 and transferred out to the controller 102, where the ECC engine 226/256 can be used to decode the ECC codewords. In decoding an ECC codeword, the controller 102 can determine the amount of error, or BER, of the user date from the code word. Consequently, by reading out ECC codewords from the selected block and transferring these to the controller 102, the controller can obtain a good estimate of the BER for the block. As a memory system, particularly a large memory system such as an SSD can have a very large number of high capacity memory die, reading out and checking all ECC codewords would consume a large amount of time. Additionally, as the goal of the read scan is not to actually extra the data content, but just to determine the quality of the data, it would generally be excessive. To provide an accurate read scan, it is usually sufficient to just read out and sent to the controller a sample of the ECC codewords from the block to the controller. A number of embodiments can be used. For example, only one ECC codeword or a few ECC codewords per page may be checked, where this could just be the first ECC codewords on the page or one or more codes words from specific areas of a word line. In a simple case, just the first ECC codeword may be checked in the scan; or, if a particular memory structure is known to commonly have defects in a particular array region, such the ends of the word lines where the first and last ECC codewords of a page are written, then the first and last ECC codewords could be checked. When a word line stores multiple pages of data, all of the pages or only a subset of pages can be checked in the scan: for example, if common errors are most frequent found in one of the pages (e.g., the upper page), the scan might only check the first ECC codeword of the upper page in a word line. Similarly, all word lines of a block, or only a sample set of word lines, may be checked in a block. Generally speaking, the amount of a block's content checked in the read scan is a trade-off between accuracy and performance, but in most application a representative sample, such as one ECC codeword for each data page of a block, is sufficient.

After reading sample codewords from the selected block at step 1403, the sample ECC codewords from the block are sent to the controller 102 at step 1405, where they are decoded to determine their BER at step 1407. Depending on the embodiment, all of the block of a set of blocks corresponding to CVD time tag can be decoded and then checked at step 1311 of FIG. 13, in which case the flow of FIG. 14 would skip to step 1413; or the blocks of the set can each be checked after the BER is determined in step 1407, in which case the flow of FIG. 14 continues on to step 1409.

In step 1409 the block's BER is checked against the threshold value and, if the block's BER exceeds the threshold, at step 1411 the controller 102 instructs the memory die 300 to relocate the block. If the block's BER does not exceed the threshold, the flow continues on to step 1413. Steps 1409 and 1411 correspond to steps 1311 and 1313 of FIG. 13 as described above, but now for a single block at a time. After step 1411, the flow continues on to step 1413. Step 1413 determines where there are more blocks in the set corresponding to the CVD time tag selected at step 1305 and, if so, loops back to step 1401. If all blocks in the set have been read scanned, the flow returns to step 1305 (if steps 1407 and 1409 are included) or to step 1311 (if steps 1409 and 1411 are skipped).

One embodiment includes an apparatus including a non-volatile memory and one or more control circuits. The non-volatile memory comprises a plurality of blocks, each block having a plurality of non-volatile memory cells. The one or more control circuits are configured to maintain, for each of a plurality of sets of blocks, an estimate of error for the set of blocks as a whole, where each set of blocks includes a plurality of blocks and each of the blocks belong to one of the sets of blocks and establish an order for the sets of blocks based on the estimates of error. The one or more control circuits are further configured to scan one or more of the sets of blocks according to the order, including individually scanning individual blocks of a set of blocks being scanned to determine a corresponding amount of error for each of the individual blocks of the set of blocks being scanned.

One embodiment includes a method that includes maintaining, for each of a plurality of groups of blocks of a non-volatile memory, corresponding metadata including a heath indicator value, each of the groups including a distinct plurality of blocks. The groups are ranked according to the corresponding health indicator values. The one of more of the groups are scanned in an order based on the ranking, the scanning of a group including: for each block of the group, reading a portion of the data stored in the block; and determining an error rate for each of the blocks based on the reading of the portion of the data stored in the block.

One embodiment includes a non-volatile memory system of one or more memory die and a controller. The one or more memory die each have a plurality of blocks of non-volatile memory cells. The controller is configured to maintain a data quality level indication for each of a plurality of regions of the one or more memory die. Each of the regions includes a plurality of blocks and each of the blocks belonging to one of the regions. The controller is further configured to determine a region ordering for the regions based on the quality level indications, select a region based on the region ordering, and to determine an error estimation for the data of each of the blocks of the selected region.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
a non-volatile memory comprising a plurality of blocks formed on one or more memory die, each block having a plurality of non-volatile memory cells; and
one or more control circuits configured to:
  maintain, for each of a plurality of sets of blocks, an estimate of bit error rate for the set of blocks as a whole, where each set of blocks corresponds to a physically adjacent plurality of blocks on one of the memory die and includes a plurality of blocks, each of the blocks belonging to one of the sets of blocks;
  establish an order for the sets of blocks based on the estimates of bit error rate; and
  scan one or more of the sets of blocks according to the order, including:
    ordering the individual blocks within a set to be scanned; and
    individually scanning the individual blocks of the set of blocks being scanned according to the ordering of the individual blocks within the set to be scanned; and
    determine a corresponding amount of error for each of the individual blocks of the set of blocks being scanned.

2. The apparatus of claim 1, wherein the one or more control circuits are further configured to compare the corresponding amount of error for the individual blocks against a threshold value and, in response to the amount of error exceeding threshold value, refreshing the corresponding block.

3. The apparatus of claim 1, wherein the one or more control circuits are configured to order the individual blocks within the set to be scanned based on a program/erase count of each of the individual blocks.

4. The apparatus of claim 1, wherein the one or more control circuits are configured to order the individual blocks within the set to be scanned based on operating conditions of the apparatus.

5. The apparatus of claim 1, wherein each of the blocks include a plurality of word lines, each word line storing a plurality of ECC codewords, and the one or more control circuits are further configured to scan the individual blocks by reading and decoding a single ECC codeword from a scanned word line.

6. The apparatus of claim 1, wherein each of the blocks is configured to store a plurality of pages of data, a page of data including a plurality of ECC codewords, and the one or more control circuits are further configured to scan the individual blocks by reading and decoding a single ECC codeword from a scanned page of data.

7. The apparatus of claim 1, wherein the non-volatile memory comprises a monolithic three-dimensional semiconductor memory device where the non-volatile memory cells are arranged in multiple physical levels above a substrate and comprise a charge storage medium.

8. A method, comprising:
maintaining, for each of a plurality of groups of blocks of a non-volatile memory, corresponding metadata including an estimated bit error rate for the group of blocks, each of the groups of blocks including a distinct plurality of physically adjacent blocks on a memory die;
ranking the groups of blocks according to the corresponding estimated bit error rate; and
scanning one of more of the groups of blocks in an order based on the ranking, the scanning of a group including:
for each block of the group, reading a portion of data stored in the block;
determining an error rate for each block of the group of blocks based on the reading of the portion of the data stored in the block;
determining an ordering of the blocks within a group to be scanned; and
scanning the blocks within the group according to the ordering of the blocks within the group to be scanned.

9. The method of claim 8, wherein the ordering of the blocks within the group to be scanned is based on program/erase counts of the blocks within the group.

10. The method of claim 8, further comprising:
comparing the determined error rate for each of the blocks to a threshold; and
in response to the error rate of a block exceeding the threshold:
reading out data of the block;
correcting the read out data of the block; and
rewriting the corrected data to the non-volatile memory.

11. The method of claim 8, wherein each of the blocks stores a plurality of pages of data, each of the pages including multiple ECC codewords, and the reading the portion of the data stored in the block includes:
reading out and decoding an ECC codeword word for each page of the block.

12. The method of claim 8, wherein the reading of the portion of data stored in the block includes reading one or more ECC codewords from the block, and determining an error rate includes decoding of the ECC codewords.

13. A non-volatile memory system comprising:
one or more memory die, each having a plurality of blocks of non-volatile memory cells; and
a controller for the non-volatile memory system, the controller configured to maintain a data quality level indication for each of a plurality of regions of the one or more memory die, each of the regions including a plurality of physically adjacent blocks on one of the memory die, and each of the blocks belonging to one of the regions, the controller further configured to determine a region ordering for the regions based on the quality level indications, to select a region based on the region ordering, to determine an error estimation for data of each of the blocks of the selected region, to determine a block ordering for the blocks of selected region, and to determine the error estimation for data of each of the blocks of the selected region according to the block ordering.

14. The non-volatile memory system of claim 13, where in the block ordering is based on program/erase counts of the blocks within the selected region.

15. The non-volatile memory system of claim 14, wherein, in response to the error estimation for data of a block exceeding a threshold, the controller is further configured to perform a refresh operation on the block for which the error estimation for the data exceeds the threshold.

16. The non-volatile memory system of claim 15, wherein the refresh operation includes reading out data of the block for which the error estimation for the data exceeds the threshold, correcting the read out data, and writing the corrected data to a different block.

* * * * *